(12) United States Patent
Kuznetsov (10) Patent No.: US 7,651,873 B1
(45) Date of Patent: Jan. 26, 2010

(54) METHOD RELATING TO THE ACCURATE POSITIONING OF A SEMICONDUCTOR WAFER

(75) Inventor: Vladimir Kuznetsov, Utrecht (NL)

(73) Assignee: ASM International N.V., Bilthoven (NL)

( * ) Notice: Subject to any disclaimer, the term of this patent is extended or adjusted under 35 U.S.C. 154(b) by 53 days.

(21) Appl. No.: 12/168,414

(22) Filed: Jul. 7, 2008

(51) Int. Cl.
*H01L 21/66* (2006.01)
*G01R 31/26* (2006.01)
(52) U.S. Cl. .......... 438/14; 257/E21.521; 257/E21.529; 356/503; 356/505; 356/630; 356/908
(58) Field of Classification Search .................. 438/14, 438/FOR. 101, FOR. 142; 257/E21.521, 257/E21.529; 356/503, 505, 630, 908
See application file for complete search history.

(56) References Cited

U.S. PATENT DOCUMENTS

2003/0181040 A1* 9/2003 Ivanov et al. ............... 438/687
2004/0071874 A1* 4/2004 Shimizu et al. .......... 427/248.1

\* cited by examiner

*Primary Examiner*—Michelle Estrada
(74) *Attorney, Agent, or Firm*—Weingarten, Schurgin, Gagnebin & Lebovici LLP (57) ABSTRACT

Disclosed is a method involving repeatedly measuring a pressure within a flow of processing gas that is provided in a semiconductor processing apparatus for treatment of a semiconductor substrate, such as a semiconductor wafer. The flow of processing gas is made to extend between a surface of the substrate and a surface of a processing body. From the pressure measurements the occurrence of an event that is related to a variation in the position of the substrate's surface relative to the surface of the processing body is determined.

21 Claims, 6 Drawing Sheets

Figure 3B

METHOD RELATING TO THE ACCURATE POSITIONING OF A SEMICONDUCTOR WAFER

TECHNICAL FIELD OF THE INVENTION

The invention relates to the field of semiconductor processing, and more in particular, to methods of system adjustment and wafer positioning.

BACKGROUND

In many semiconductor wafer processing systems wafers undergo treatments, such as annealing or deposition, by subjecting them to a flow of processing gas. Especially when the wafer is floatingly supported by such a gas flow, without further mechanical constraints, positioning the wafer within a few hundred micrometers from a desired position near a processing body is a prudent task that needs to be executed carefully. The accurate positioning of the wafer is required for reliable system performance and a repeatable and high quality processing result, and implies accurate control over the distance between the processing body and the wafer. For such accurate control, some type of measurement of the distance between the processing body and the wafer would be highly desirable.

Distance determination involving optical measurements is inflicted with the difficulty of a variable reflectivity of the wafer, depending on the combination of films of dielectric and conductive materials that have been deposited on the wafers. Some combinations of films may be highly reflective whereas other combinations may be highly anti-reflective. Further, mechanical measurements are difficult to implement in complex semiconductor equipment and in many cases mechanical contact with the wafer is not desirable and/or acceptable.

In one embodiment, it is an object of the present disclosure to provide a method for accurately determining a change in a distance between a processing body and a wafer. In another embodiment, it is an object of the present disclosure to provide a method for accurately monitoring the alignment of a wafer handler relative to a processing body. In yet another embodiment, it is an object to provide a method for detecting variations in the thickness of a substantially flat wafer, which variations may influence the position of the wafer relative to a processing body.

SUMMARY OF THE INVENTION

A method is disclosed including providing a semiconductor processing apparatus comprising at least a first processing body, the first processing body having a substantially flat surface, and the first processing body being provided with at least one gas conduit for discharging processing gas at said surface; providing a wafer, the wafer having a substantially flat, plate-like shape such that it comprises a first and a second main surface, and the wafer being positioned with its first main surface parallel to the surface of the first processing body, such that both surfaces face each other in proximity, thus defining a gap between them. The method further includes effecting a flow of processing gas that extends through the at least one gas conduit and through the gap between the first processing body's surface and the wafer's first main surface. The method also includes repeatedly measuring a pressure of the processing gas within the gas flow; and determining from the pressure measurements the occurrence of an event that is related to a variation in the position of the wafer's first main surface relative to the surface of the first processing body.

According to one embodiment of the disclosed method, the event is a change the width of the gap between the first processing body's surface and the wafer's first main surface.

In another embodiment, for the purpose of monitoring the vertical alignment of a wafer handler relative to the surface of the first processing body, the method further includes providing a wafer handler, the wafer handler being moveable relative to the first processing body's surface, and the wafer handler being positioned in horizontal alignment with the surface of the first processing body; and providing a position sensor for measuring the vertical position of the wafer handler relative to the surface of the first processing body. The method also includes vertically moving the surface of the first processing body relative to the wafer handler in a direction towards each other for transferring the wafer from the wafer handler to the gas flow, or in a direction away from each other for transferring the wafer from the gas flow to the wafer handler. The method also includes, together with measuring a pressure of the processing gas within the gas flow, measuring a vertical position of the first processing body's surface relative to the wafer handler in the course of vertically moving the surface of the first processing body relative to the wafer handler; determining from said pressure and vertical position measurements the relative vertical position at which the event that is related to a variation in the position of the wafer's first main surface relative to the surface of the first processing body occurred; comparing the vertical position at which the event occurred with a predetermined reference position of that event; and providing a signal in case the vertical position at which the event occurred does not correspond to the predetermined reference position.

The event may, for example, be a transfer of the wafer from the wafer handler to the flow of processing gas, or a transfer of the wafer from the flow of processing gas to the wafer handler.

In yet another embodiment of the disclosed method, the method includes providing a second processing body opposite the first processing body, the second processing body having a substantially flat surface, and the second processing body being provided with at least one gas conduit for discharging processing gas at the second processing body's surface, whereby the second processing body's surface is positioned parallel to the second main surface of the wafer such that both surfaces face each other in proximity, thus defining a gap between them; effecting a flow of processing gas that extends through the at least one gas conduit in the second processing body and through the gap between the second processing body's surface and the wafer's second main surface; and repeatedly measuring a pressure of the processing gas within the gas flow through either body. The method also includes determining from said pressure measurements, as the event that is related to the position of the wafer's first main surface relative to the surface of the first processing body a change in the thickness of the wafer, which change corresponds to a variation in the measured pressures.

The invention will be more fully understood from the following detailed description of certain embodiments of the invention, taken together with the accompanying drawings, which are meant to illustrate and not to limit the invention.

DETAILED DESCRIPTION

The disclosed method involves repeatedly measuring a pressure within a flow of processing gas that is provided in a semiconductor processing apparatus for treatment of a semiconductor substrate such as a semiconductor wafer. "Semiconductor processing" is understood to include related processing technologies of substantially flat and plate like substrates such as the processing of flat panel displays, magnetic media, micromechanical devices and optical devices, whereas "semiconductor substrate" or "wafer" is understood to include such substrates. The flow of processing gas is made to extend through a gap between a substantially flat surface of a wafer and a substantially flat surface of a processing body. In the Figures, the processing body is depicted as a plate or plate-like object, though in principle the processing body may have any shape. To provide for the flow of processing gas through the gap, the processing body is fitted with at least one conduit. The at least one conduit is made such that one end of the conduit discharges at the surface of the processing body facing the wafer, whereas another end of the conduit is placed in communication with a gas feed. Processing gas may then be made to flow from the gas feed, through the conduit in the processing body and through the gap between the processing body and the wafer located opposite the at least one conduit in the processing body. As the wafer interferes with the flow of processing gas emanating from the conduit in the processing body, the pressure inside the gas flow provides information about the distance between the wafer and processing body (which are oriented in a parallel manner), and thus about the relative positions of the processing body and the wafer. Using a series of pressure measurements, the occurrence of different events may be determined that inherently relate to the relative positions of the processing body and the wafer. It is noted that successive pressure measurements are preferably performed with the processing body, the wafer and the gas all having the same temperature in order to avoid effects of a changing gas temperature on the pressure measurements.

The invention will be further explained with reference to FIGS. 1-3 wherein like reference numerals are used to indicate similar parts.

A first embodiment of the invention is described with reference to FIG. 1. As shown in FIG. 1A, a processing body 100, close to an upper surface of which a wafer 150 is to be placed, is provided with a gas feed 102 and conduits 104 in communication with the gas feed 102. The conduits 104 discharge at the surface of the processing body 100 facing the wafer 150. A pressure sensor 106 is provided in communication with the gas feed 102 to measure the pressure inside the gas feed 102. A flow of processing gas from a gas source (not shown) is provided to the gas feed 102 and through the conduits 104. Typically, the gas flow has a flow rate in the range of 0.1 to 5 slm. Pressure sensor 106 measures the pressure of the gas inside gas feed 102. A wafer handler, contacting a wafer 150 with support pins 152, holds the wafer 150 at a specified position and waits for it to be picked up by the processing body 100, or more precisely, by the gas flow emanating from the conduits 104 in the upper surface of the processing body. Processing body 100 can be moved vertically up and down by a push rod 110, which is powered by a drive mechanism (not shown). The vertical position of the processing body can be measured by a position sensor such as an encoder. Preferably, processing body 100 is provided with recesses to accommodate support pins 152 when the processing body is moved upward. When the wafer 150 is in horizontal alignment with processing body 100 (as shown), processing body 100 is moved vertically upward while the gas pressure is measured by pressure sensor 106.

Figure 1A:
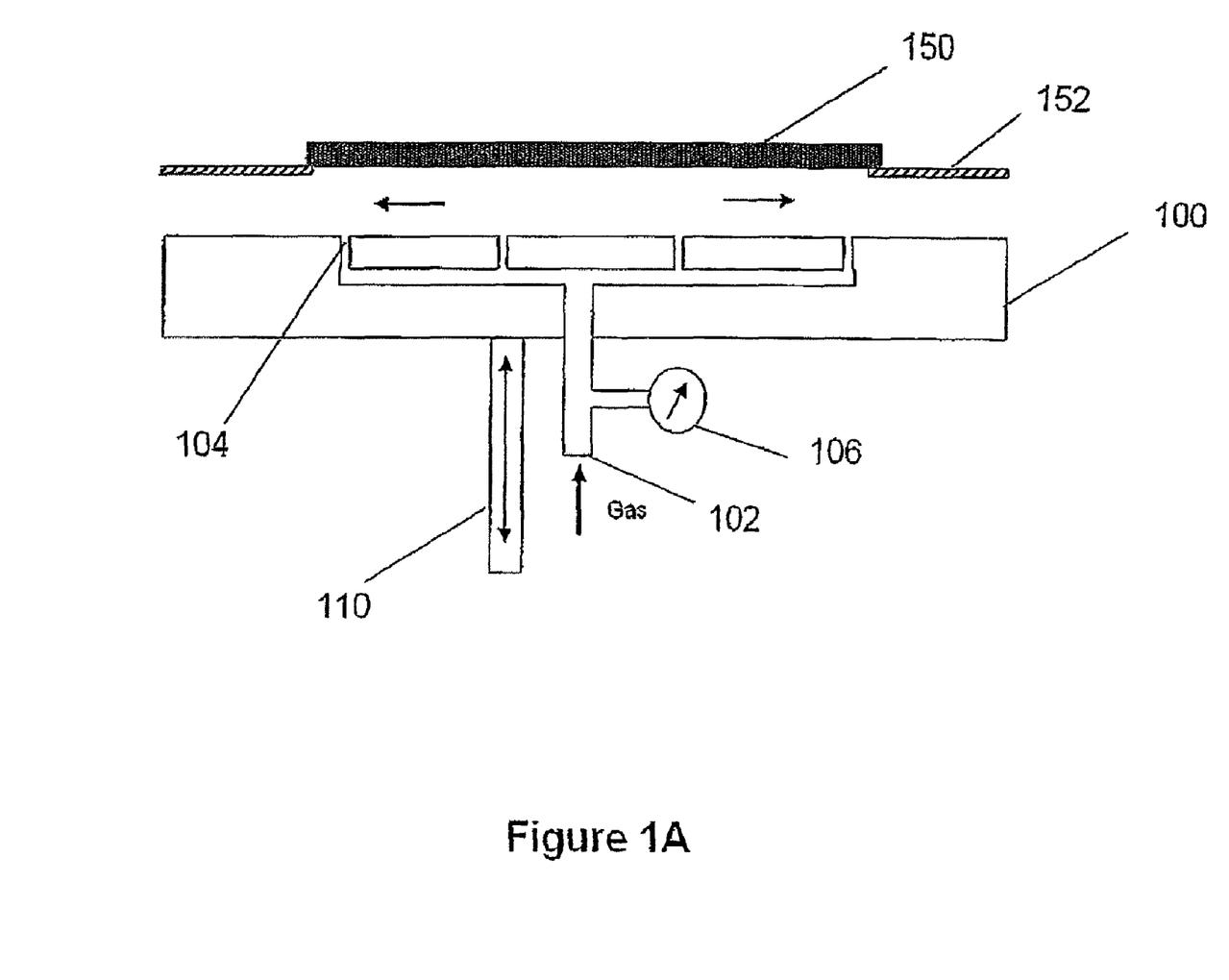
FIG. 1A schematically shows a first embodiment of a wafer processing apparatus that may be used to execute the disclosed method.
Figure 1B:
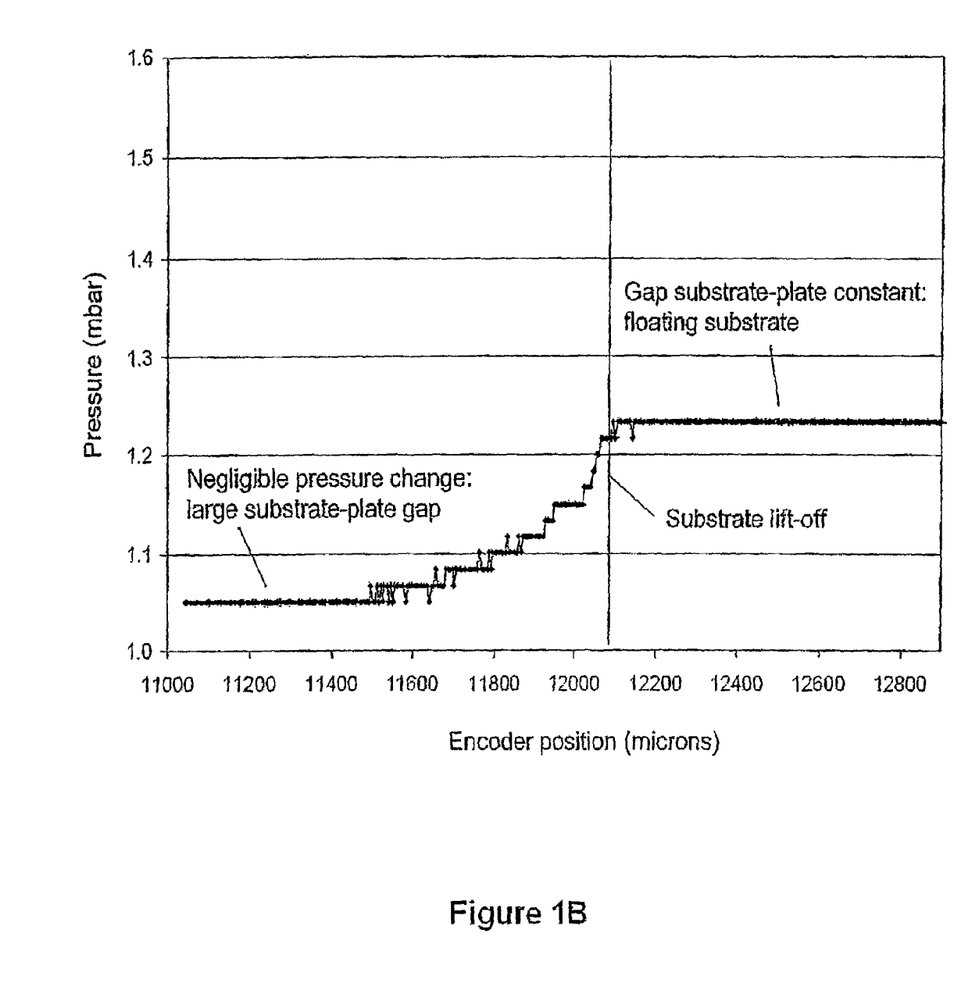
FIG. 1B shows the measured pressure versus measured processing body position of the first embodiment.

A graph of the gas pressure as a function of encoder position is shown in FIG. 1B for a nitrogen flow of 4 slm and a processing body 100 configured to receive a circular wafer 150 having a diameter of 300 mm. On the left of FIG. 1B, where the distance between processing body 100 and wafer 150 is relatively large, the measured pressure does not depend on the actual processing body position but only on the magnitude of the gas flow and the conductance of the gas feed 102 and the conduits 104. When the processing body 100 approaches the wafer 150, the pressure starts to increase due to the restriction for the gas flow formed by the narrowing gap between the wafer 150 and the surface of the processing body 100 facing the wafer. From position 12100 μm and higher, the pressure does not increase further but remains constant. At position 12100 μm, the wafer has been lifted off of the support pins 152 and when the processing body 100 is moved upward further, the wafer 150 floats at a constant distance above the surface of the processing body 100 resulting in a constant value for the measured gas pressure.

Employing the above-described method, the encoder position at which wafer lift-off occurs can be determined accurately, without a need of contacting the wafer 150. During continued use of the apparatus, a change in the encoder position at which wafer lift-off is detected may be observed. This may indicate that the alignment of the wafer handler relative to the processing body 100 has changed, and that re-alignment is needed.

Further, when the pressure measurement bears a relation to the relative positions of processing body 100 and the wafer 150, that is, when the measured pressure changes when the distance between the processing body 100 and the wafer 150 is changed, the pressure readings may be used to determine the actual gap width between them. A model to relate the measured pressure to the distance between the processing body 100 and the wafer 150 may be based on a mathematical/ physical model or on a series of calibration measurements, the latter option generally being less complicated. To obtain a model through calibration measurements, one may measure the gas pressure at defined gap widths between the processing body 100 and the wafer 150 so as to arrive at a functional relation between the two quantities. It is noted that such a relation is accurate only for the mass flow rate and gas temperature at which the pressure measurements were conducted.

Figure 2A:
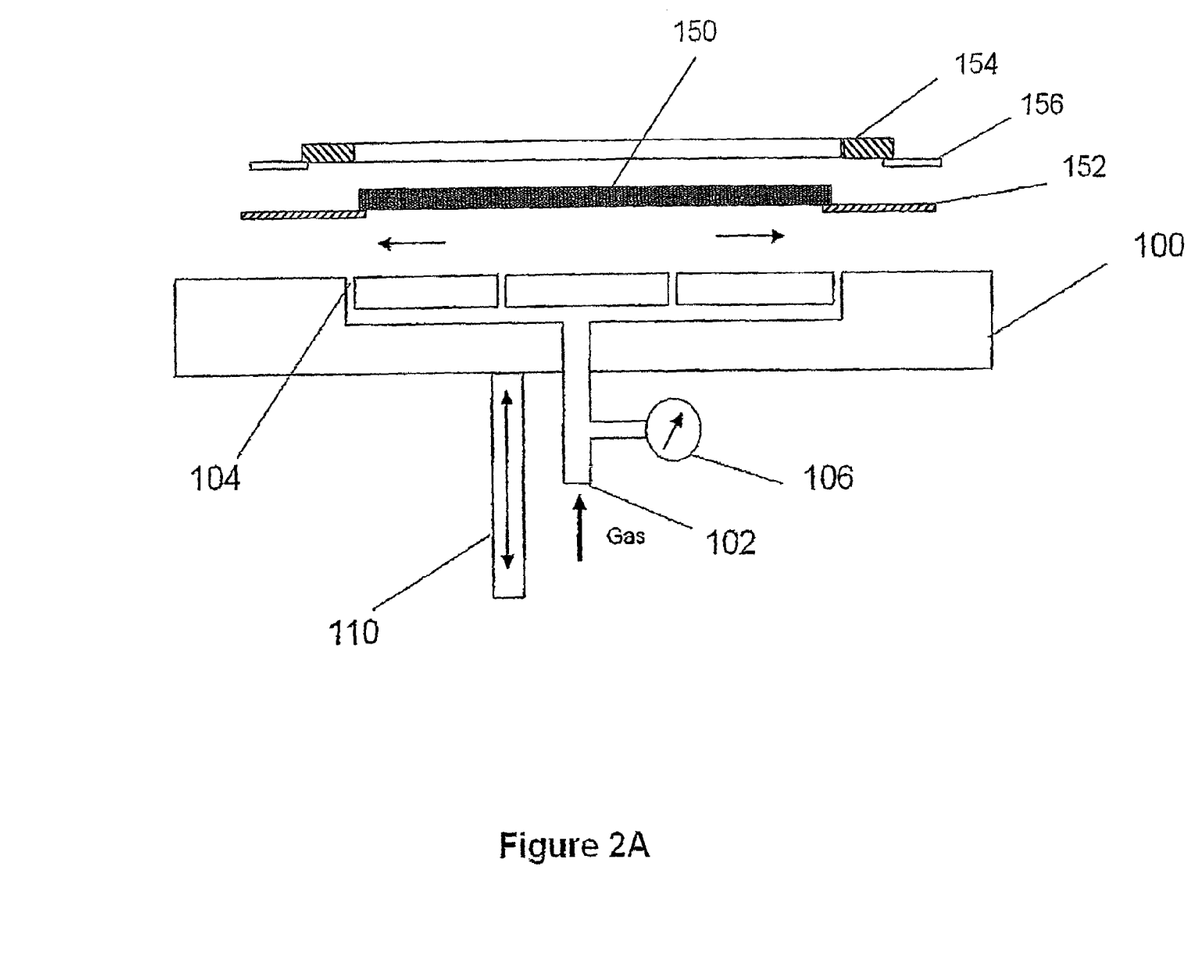
FIG. 2A schematically shows a second embodiment of a wafer processing apparatus that may be used to execute the disclosed method.
Figure 2B:
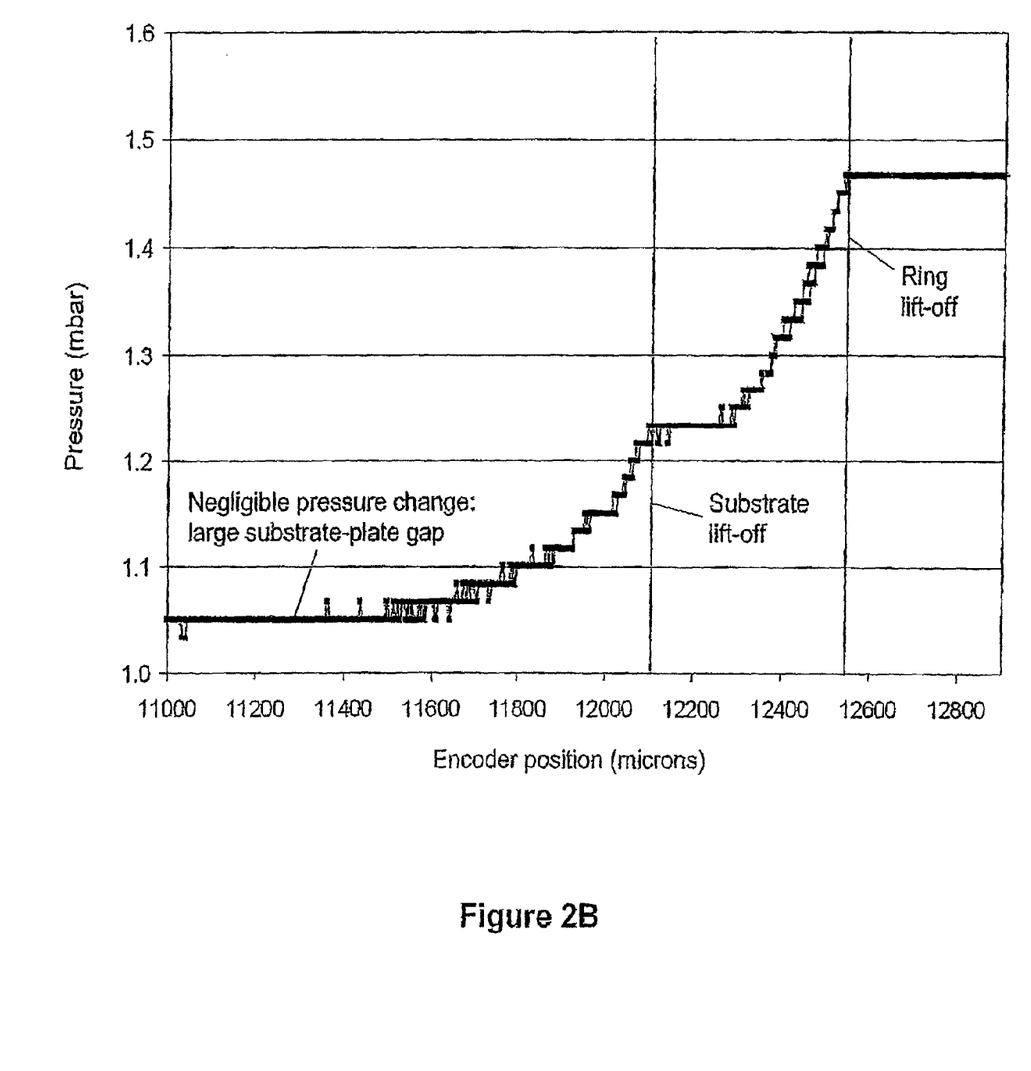
FIG. 2B shows the measured pressure versus measured processing body position of the second embodiment.

A second embodiment is shown in FIG. 2. In FIG. 2A, an additional ring 154 that is capable of fittingly receiving the wafer 150 is present. The ring 154 is supported on support pins 156, which in turn are connected to the wafer handler (not shown). Wafer 150 and ring 154 may be moved synchronously by the wafer handler. FIG. 2B illustrates that, as processing body 100 is moved toward the combination of wafer 150 and ring 154, first the wafer 150 is lifted off of the support pins 152, and then the ring 154 is lifted off of support pins 156. Depending on the relative positions and sizes of the wafer 150 and the ring 154, it is possible that the wafer 150 and the ring 154 are lifted off of their respective support pins in reverse order. Note that the vertical positions at which the events 'wafer lift-off' and 'ring lift-off' occur are easily recognizable in FIG. 2B due to the slope-transitions of the curve that accompany these events. Though a computer may locate the slope-transitions by analyzing the data set of pressure-position coordinates without reference to any graphical representation thereof, the data set may still be thought of as defining a (virtual) curve, which allows us to conveniently relate to the concept of a slope-transition.

Figure 3A:
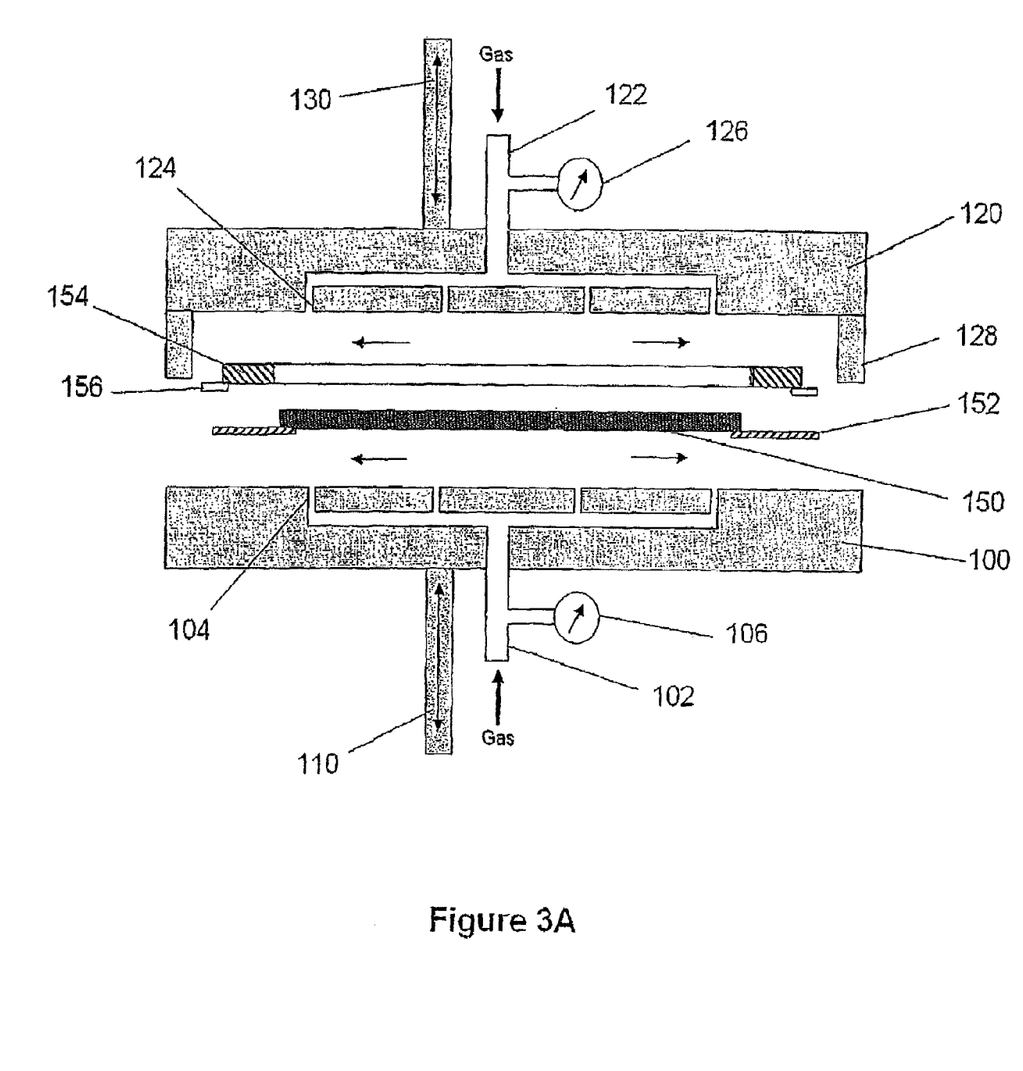
FIG. 3A schematically shows a third embodiment of a wafer processing apparatus that may be used to execute the disclosed method.

A third embodiment is shown in FIG. 3. In this embodiment a wafer 150/ring 154 combination is disposed between two facing processing bodies 100, 120. Apart from the spacers 128, the two processing bodies 100, 120 are essentially mirror images of each other. Like the lower processing body 100, the top processing body 120 is provided with a gas feed 122 in communication with a number of gas conduits 124. The conduits 124 discharge at the lower surface of the processing body 120 facing the upper surface of the wafer 150. A pressure sensor 126 is provided in communication with a gas feed 122 to measure the pressure inside the gas feed 122. A gas flow is provided to gas feed 122 and through conduits 124. During placement of the wafer 150 the bottom processing body 100 and the top processing body 120 are in a spaced apart position to allow the wafer handler to access the space between them. After placement of the wafer 150 the processing bodies 100, 120 may be moved towards each other until a processing position is achieved.

An example of an apparatus according to this third embodiment is ASM's Levitor® wafer processing apparatus for Rapid Thermal Annealing processes as described in U.S. Pat. Nos. 6,183,565 and 6,551,404.

Figure 3B:
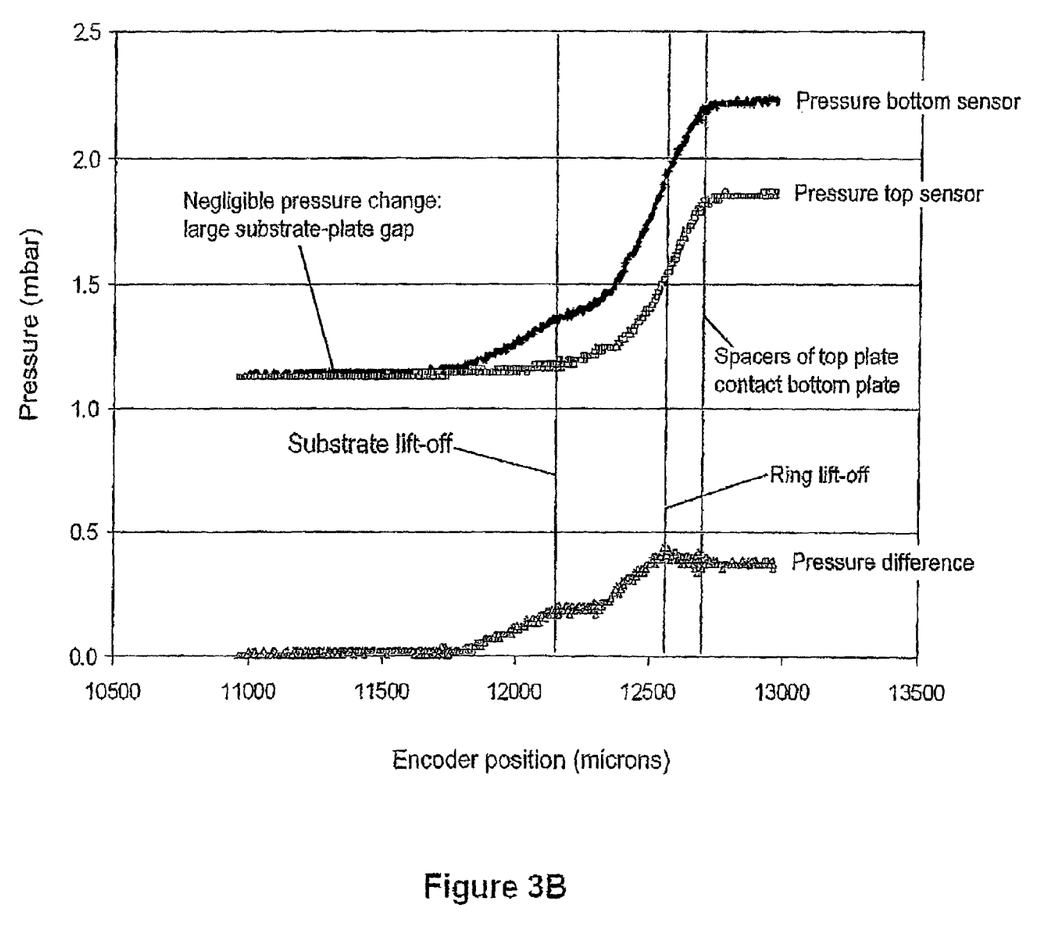
FIG. 3B shows the measured pressures versus measured processing body position of the third embodiment.

In the embodiment of FIG. 3, first the top processing body 120 is moved downward over some distance. Then the bottom processing body 100 is moved upward until the processing position is reached. Top processing body 120 may be provided with spacers 128 to contact the upper surface of bottom processing body 100, the spacers 128 leaving a defined distance between the facing surfaces of bottom and top processing bodies 100 and 120. The pressures measured by pressure sensors 106 and 126 as a function of position of bottom processing body 100 are presented in the graph of FIG. 3B. On the left of the graph, which side corresponds to large gaps between the wafer 150 and the processing bodies 100, 120, equal pressures are measured by sensors 106 and 126. Obviously, the measured pressures depend on the conductance of gas feeds 102, 122 and conduits 104, 124. After an initially flat part of the curve on the left of the graph, more to the right, the pressures start to increase and different events such as wafer lift-off, ring lift-off and spacers 128 contacting bottom processing body 100 can be determined from changes in the slopes of the pressure curves. These events can be even better identified from the pressure differences between the pressures measured by the sensors 106, 126, which pressure differences are shown in the curve at the bottom of FIG. 3B. When the spacers 128 contact the bottom processing body 100, the pressure difference between the pressures measured by sensor 106 and 126 remains constant. This pressure difference corresponds to the weight of the wafer 150 and the ring 154 that are floatingly supported by the gas flow emanating from conduits 104 in lower processing body 100. The pressure difference is about 0.2 mbar for a 300 mm silicon wafer and 0.4 mbar for a 300 mm silicon wafer/ring combination.

Events like wafer lift-off, ring lift-off, and the contacting of bottom and top processing bodies are detectable from slope transitions in the pressure versus vertical processing body position curves or from the pressure difference curve. A changing slope can be detected easily by calculating the second derivative of the respective pressure curve as a function of the vertical processing body position. As stated before, a computer may locate the slope-transitions without reference to an actual, graphically represented 'curve', but may use the pressure-vertical position coordinates—which provide the same information—instead.

Although only the placement of a wafer 150 by the wafer handler onto the processing body 100 was described in the description of FIGS. 1-3 above, it will be understood that the same principle applies to the removal of the wafer 150 by the wafer handler from the processing body 100. In general, it applies to the transfer of a wafer 150 from a wafer handler to a processing body 100, and vice versa.

Although in the discussed embodiments events like wafer lift-off were detected, it is also possible to simply use the measured pressure at a given encoder position as an indication of distance between processing body and wafer and to use a change in pressure as an indication of a change in this distance. Such a change in distance may correspond to a change in alignment of the wafer handler relative to the processing body 100. In that case, the alignment may have to be adjusted until a desired, predetermined pressure is measured corresponding to a desired alignment.

Although in the shown embodiments, the bottom processing body 100 is provided with a vertical drive mechanism with encoder, and the wafer handler remains vertically stationary, it is also possible to provide the wafer handler with such a driving mechanism plus encoder, and to move the wafer handler vertically downward to lift off the wafer 150 while the bottom processing body 100 remains stationary. Further, it is possible to provide both the processing body 100 and the wafer handler with a drive mechanism and an encoder. In the case of two processing bodies 100, 120 and one wafer handler, at least two of the three parts are preferably movable. In the exemplary embodiment of FIG. 3, the processing bodies 100, 120 were moved one after another but it is also possible to move the two processing bodies simultaneously although the interpretation of the pressure curves might become more complicated.

Further, in the present embodiments the wafer remains floating on the gas flow but it is also possible to (gradually) switch off the gas flow after lift-off is detected, so that the wafer 150 comes to rest on the surface of the processing body 100. In a further alternative embodiment, the processing body may be provided with support pins or ridges to support the wafer above the surface of the bottom processing body. Upon moving the wafer handler and the processing body vertically toward each other the wafer is lifted from support pins 122 of the wafer handler by the support pins or ridges on processing body 100.

In the embodiment of FIG. 3, wherein a wafer is accommodated between two facing processing bodies, with gas cushions between each of the processing bodies and the wafer, the method of the invention can also be used for accurate, non-contact wafer thickness measurements. Because of the gas cushions, the gap between the wafer and the processing bodies can be small, e.g. 150 μm without a risk of damaging the wafer. When the wafer is warped, it will be gently pushed straight by the gas cushions. Suppose the pressure measurement can be performed with an accuracy of 1%. If a wafer is 1 μm thicker (thinner) than the target value, the gaps at both sides of the wafer will be 0.5 μm or 0.33% narrower (wider) for a gap width of 150 μm. The pressure drop over the gap is in first approximation proportional to the gas flow and inversely proportional to the third power of the gap width. This means, again in first approximation, that a 0.33% change in gap width will result in a 3×0.33%=1% change in pressure. Consequently, in this example a pressure measurement with an accuracy of 1% allows for a thickness measurement with an accuracy of 1 μm. Obviously, the gas flows and the gap width can be adapted for higher or lower accuracy in thickness measurement.

Although illustrative embodiments of the present invention have been described in detail with reference to the accompanying drawings, it is to be understood that the invention is not limited to these embodiments. Various changes or modifications may be effected by one skilled in the art without departing from the scope or the spirit of the invention as defined in the claims. Accordingly, reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that the particular features, structures, or characteristics may be combined in any suitable manner in one or more embodiment.

I claim:

1. A method comprising:
providing a semiconductor processing apparatus comprising at least a first processing body, the first processing body having a substantially flat surface, and the first processing body being provided with at least one gas conduit for discharging processing gas at said surface;
providing a wafer, the wafer having a substantially flat, plate-like shape such that it comprises a first and a second main surface, and the wafer being positioned with its first main surface parallel to the surface of the first processing body, such that both surfaces face each other in proximity, thus defining a gap between them;
effecting a flow of processing gas that extends through the at least one gas conduit and through the gap between the first processing body's surface and the wafer's first main surface;
repeatedly measuring a pressure of the processing gas within the gas flow; and
determining from the pressure measurements a occurrence of an event that is related to a variation in the position of the wafer's first main surface relative to the surface of the first processing body.

2. A method according to claim 1, wherein the event is a change in the width of the gap between the first processing body's surface and the wafer's first main surface, the event being detectable by a difference between any two successive pressure measurements.

3. A method according to claim 1, which for the purpose of monitoring the vertical alignment of a wafer handler relative to the surface of the first processing body further comprises:

providing a wafer handler, the wafer handler being moveable relative to the first processing body's surface, and the wafer handler being positioned in horizontal alignment with the surface of the first processing body;
providing a position sensor for measuring the vertical position of the wafer handler relative to the surface of the first processing body;
vertically moving the surface of the first processing body relative to the wafer handler in a direction towards each other for transferring the wafer from the wafer handler to the gas flow, or in a direction away from each other for transferring the wafer from the gas flow to the wafer handler;
together with measuring a pressure of the processing gas within the gas flow measuring a vertical position of the first processing body's surface relative to the wafer handler in the course of vertically moving the surface of the first processing body relative to the wafer handler;
determining from said pressure and vertical position measurements a relative position at which the event that is related to a variation in the position of the wafer's first main surface relative to the surface of the first processing body occurred;
comparing the vertical position at which the event occurred with a predetermined reference position of that event; and
providing a signal in case the vertical position at which the event occurred does not correspond to a predetermined reference position.

4. A method according to claim 3, further comprising:
in response to said signal, realigning the wafer handler and the first processing body, such that after realignment the event will occur at the predetermined reference position.

5. A method according to claim 3, wherein the occurrence of the event is determined by locating a slope-transition in the pressure versus vertical position curve that is defined by the measurement data.

6. A method according to claim 3, wherein the wafer handler is configured for handling both a ring and a wafer in horizontal alignment with each other but at different vertical levels, the ring having a central opening in which the wafer is receivable, and the ring being floatingly receivable by the flow of processing gas, parallel to and near the surface of the first processing body.

7. A method according to claim 3, wherein a slope-transition in a vertical position curve corresponds to one of the following events: transfer of the wafer from the wafer handler to the flow of processing gas, transfer of the wafer from the flow of processing gas to the wafer handler, transfer of a ring from the wafer handler to the flow of processing gas, transfer of a ring from the flow of processing gas to the wafer handler.

8. A method according to claim 1, including:
providing a second processing body opposite the first processing body, the second processing body having a substantially flat surface, and the second processing body being provided with at least one gas conduit for discharging processing gas at the second processing body's surface, whereby the second processing body's surface is positioned parallel to the second main surface of the wafer such that both surfaces face each other in proximity, thus defining the gap between them;
effecting a flow of processing gas that extends through the at least one gas conduit in the second processing body and through the gap between the second processing body's surface and the wafer's second main surface;
repeatedly measuring a pressure of the processing gas within the gas flow through either body; and determining from said pressure measurements, as the event that is related to the position of the wafer's first main surface relative to the surface of the first processing body, a change in a thickness of the wafer, which change corresponds to a variation in the measured pressures.

9. A method according claim 1, wherein a gap between a main surface of the wafer and the surface of a processing body is less than 1 mm wide.

10. A method according to claim 1, wherein a flow of processing gas has a gas flow rate in the range of 0.1 to 5 standard liters per minute.

11. A method according to claim 1, wherein the wafer is floatingly supported by a flow of processing gas.

12. A method according to claim 1, further comprising subjecting the wafer to a thermal annealing treatment by means of the processing gas.

13. A method according to claim 1, further comprising subjecting the wafer to a deposition treatment by means of the processing gas.

14. A method according to claim 8, wherein a gap between a main surface of the wafer and the surface of a processing body is less than 1 mm wide.

15. A method according to claim 8, wherein a flow of processing gas has a gas flow rate in the range of 0.1 to 5 standard liters per minute.

16. A method according to claim 8, wherein the wafer is floatingly supported by a flow of processing gas.

17. A method according to claim 8, further comprising subjecting the wafer to a thermal annealing treatment by means of the processing gas.

18. A method according to claim 8, further comprising subjecting the wafer to a deposition treatment by means of the processing gas.

19. A method according to claim 4, wherein a slope-transition in a vertical position curve corresponds to one of the following events: transfer of the wafer from the wafer handler to the flow of processing gas, transfer of the wafer from the flow of processing gas to the wafer handler, transfer of a ring from the wafer handler to the flow of processing gas, transfer of a ring from the flow of processing gas to the wafer handler.

20. A method according to claim 5, wherein the slope-transition in said curve corresponds to one of the following events: transfer of the wafer from the wafer handler to the flow of processing gas, transfer of the wafer from the flow of processing gas to the wafer handler, transfer of a ring from the wafer handler to the flow of processing gas, transfer of a ring from the flow of processing gas to the wafer handler.

21. A method according to claim 6, wherein a slope-transition in a vertical position curve corresponds to one of the following events: transfer of the wafer from the wafer handler to the flow of processing gas, transfer of the wafer from the flow of processing gas to the wafer handler, transfer of the ring from the wafer handler to the flow of processing gas, transfer of the ring from the flow of processing gas to the wafer handler.

* * * * *